(12) United States Patent
Olson et al.

(10) Patent No.: US 6,521,853 B1
(45) Date of Patent: Feb. 18, 2003

(54) METHOD AND APPARATUS FOR SORTING SEMICONDUCTOR DEVICES

(75) Inventors: Tim Olson, Phoenix, AZ (US); Lisa Foltz, Chandler, AZ (US)

(73) Assignee: Micro Component Technology, Inc., St. Paul, MN (US)

( * ) Notice: Subject to any disclaimer, the term of this patent is extended or adjusted under 35 U.S.C. 154(b) by 0 days.

(21) Appl. No.: 09/566,458

(22) Filed: May 8, 2000

(51) Int. Cl.⁷ .............................................. B07C 5/344
(52) U.S. Cl. ..................... 209/571; 209/573; 209/905
(58) Field of Search ................................. 209/571, 573, 209/576, 587, 938, 939, 905; 198/346.2

(56) References Cited

U.S. PATENT DOCUMENTS

| | | | | |
|---|---|---|---|---|
| 3,503,500 A | * | 3/1970 | Klossika ..................... | 209/560 |
| 3,584,741 A | * | 6/1971 | Schirmer ..................... | 209/74 |
| 3,762,426 A | * | 10/1973 | Yakubowski ................ | 134/195 |
| 5,313,156 A | * | 5/1994 | Klug et al ................... | 324/158 |
| 5,848,705 A | * | 12/1998 | Gianpaolo et al. .......... | 209/571 |
| 6,021,380 A | | 2/2000 | Fredriksen et al. | |
| 6,239,396 B1 | * | 5/2001 | Kang ......................... | 209/573 |

FOREIGN PATENT DOCUMENTS

FR  1492706  8/1967

OTHER PUBLICATIONS

"Secure Die Picking of Known Good Die", *IBM Technical Disclosure Bulletin*, vol. 39, No. 5, p. 261 (May 1996).

* cited by examiner

Primary Examiner—Donald P. Walsh
Assistant Examiner—Joseph Rodriguez
(74) Attorney, Agent, or Firm—Merchant & Gould P.C.

(57) ABSTRACT

A method and apparatus is provided for sorting semiconductor devices for processing where the semiconductor devices have been singulated from a strip containing a plurality of semiconductor devices and where an electronic strip map has been created corresponding to the strip of semiconductor devices and the electronic strip map contains address and quality information related to each individual singulated semiconductor device. The method includes the steps of moving a pickup device to a location adjacent the singulated semiconductor devices and selectively picking up a first plurality of singulated semiconductor devices based on the electronic strip map information related to the singulated semiconductor devices and moving the semiconductor devices that have been picked up to a predetermined location based on the electronic strip map information related to the specific semiconductor devices that have been picked up and unloading the first plurality of semiconductor devices at the predetermined location.

3 Claims, 16 Drawing Sheets

METHOD AND APPARATUS FOR SORTING SEMICONDUCTOR DEVICES

BACKGROUND OF THE INVENTION

1. Field of the Invention

This invention relates to an apparatus and method for sorting semiconductor devices.

2. Brief Description of the Art

Various types of integrated circuit devices have evolved since the development of the semiconductor. Such semiconductor devices have innumerable applications in industry and commerce. In the manufacture of semiconductor devices, it is known to first create a strip which constitutes an integral unit containing numerous semiconductor devices within the strip. For example, a strip of semiconductor devices may have 40, 80, or 100 semiconductor devices contained within the strip. The strip of semiconductor devices are then taken to a cutting apparatus where the strip is cut into numerous units separating and singulating out each individual semiconductor device. Once the strip has been singulated into individual semiconductor devices, it is known in the industry to sort and transfer the singulated semiconductor devices to various locations for further processing. For example, it is known in the art to transfer these singulated semiconductor devices to JEDEC trays, bulk bins, shipping tubes, or a tape and real apparatus where the singulated semiconductor devices are then transferred to another location for further processing.

Various semiconductor device handlers or transfer systems have been developed within the semiconductor device industry for transferring (or off loading) the singulated semiconductor devices to predetermined locations for further processing. For example, it is known to have an automated mechanism which picks up an individual singulated semiconductor device after it has been cut from the strip and then places the singulated semiconductor device in the appropriate location such as a JEDEC tray or bulk bin. The robotic arm then returns and picks up the next singulated semiconductor device and moves it to the predetermined location for unloading the semiconductor device at the appropriate location for further processing. The problem with such systems is that by picking up individual semiconductor devices one at a time, such devices are slow and inefficient in off loading the singulated semiconductor devices for further processing. Further, such a system does not provide for any intelligent sorting of the semiconductor devices in an application where the semiconductor devices have previously been tested for quality purposes.

For example, it is known in the industry to test an entire strip of semiconductor devices so that quality information can be obtained for each individual semiconductor device located on the strip. However, the current sorting apparatuses for off loading the singulated semiconductor devices from the strip location to the predetermined off load location for further processing do not utilize any of the quality information obtained regarding the individual semiconductor devices on the strip. Rather, these current off loading systems simply transfer all of the singulated semiconductor devices, one at a time, to a predetermined off load location without regard to any quality information known about the particular semiconductor device. In other words, all the "good" and "bad" semiconductor devices are offloaded to the same location. This then requires further testing or visual inspection of different characteristics of the singulated semiconductor devices to sort the "good" and "bad" devices.

Other systems for off loading singulated semiconductors devices involve simply "dumping" the entire strip of singulated semiconductor devices into a bulk bin for transfer to a location for further processing. Numerous disadvantages with this type of system include the fact that the semiconductor devices are not retained in an orientation for ease of handling for further processing. Another disadvantage is that the devices are not sorted based on any quality information related to the specific semiconductor devices.

As noted above, it is known in the semiconductor device industry to test a strip of semiconductor devices prior to singulation of the individual semiconductor devices. In this regard, it is known in the industry to create an electronic strip map which contains address or location information and quality information (i.e., such as "good" or "bad") specific to each individual semiconductor device on the strip. For example, a strip of semiconductor devices can be submitted for testing as a whole, prior to singulation, and quality information can be obtained for each specific semiconductor device on the strip. An electronic strip map is then created which contains specific address and quality information related to each individual semiconductor device on the strip. One industry organization, Semiconductor Equipment and Materials International (SEMI), has developed draft standards for the creation of electronic strip maps for strips of semiconductor devices. However, even with the creation of electronic strip maps related to strips of semiconductor devices, the information contained in the electronic strip map has not been utilized in the industry to increase the efficiency of off loading singulated semiconductor devices from a strip for further processing.

What is needed is a method and apparatus for sorting singulated semiconductor devices which is fast and efficient in transferring the singulated semiconductor devices from the singulated location to a predetermined off load location, such as a JEDEC tray, bulk bin, etc., for further processing.

SUMMARY OF THE INVENTION

The present invention provides a method and apparatus for sorting semiconductor devices which is able to efficiently off load a strip of singulated semiconductor devices to various predetermined locations for further processing. The invention further provides an apparatus and method which is able to pick up a plurality of singulated semiconductor devices and intelligently transfer the plurality of singulated semiconductor devices to various predetermined locations for further processing.

According to one embodiment of the present invention, there is provided a method for sorting semiconductor devices for processing where semiconductor devices have been singulated from a strip containing a plurality of semiconductor devices while still retaining the semiconductor devices in a form corresponding to their positioning on the strip. Additionally, an electronic strip map has been created corresponding to the strip of semiconductor devices and the electronic strip map contains address and quality information related to each individual singulated semiconductor device. The method includes moving a pickup device to a location adjacent the singulated semiconductor devices and selectively picking up a first plurality of singulated semiconductor devices based on the electronic strip map information related to the singulated semiconductor devices. The method further includes moving the semiconductor devices that have been picked up to a predetermined location based on the electronic strip map information for the specific semiconductor devices that have been picked up and unloading the first plurality of semiconductor devices at the predetermined location.

In one embodiment, the method further includes a step of visually inspecting the first plurality of semiconductor devices which have been picked up by the pickup device for transfer to the predetermined location. The visual inspection confirms that the semiconductor devices picked up correspond to the first plurality of semiconductor devices that were selected to be picked up based on the electronic strip map information. In addition, the step of visual inspection can further include a quality inspection of the semiconductor devices that have been picked up and based on the quality inspection, modify the predetermined unload location for any semiconductor device that is determined to have a different quality characteristic than the quality characteristic indicated by the electronic strip map information for that particular semiconductor device.

In one embodiment, the method of sorting semiconductor devices further includes returning the pickup device to the singulated semiconductor units that were not previously picked up and selectively picking up a second plurality of singulated semiconductor devices based on the electronic strip map information related to the singulated semiconductor devices and moving the second plurality of semiconductor devices that have been picked up to a predetermined location based on the electronic strip map information for the specific semiconductor devices that have been picked up and unloading the second plurality of semiconductor devices at the predetermined location.

Pursuant to another embodiment of the present invention, an apparatus is provided for sorting semiconductor devices where the semiconductor devices have been singulated from a strip containing a plurality of semiconductor devices and where an electronic strip map has been created containing address and quality information related to each individual singulated semiconductor device. The apparatus includes a semiconductor device carrier adapted for receiving a plurality of singulated semiconductor devices where the semiconductor device carrier includes a base portion having a top surface divided into a plurality of cavities sized to receive an individual singulated semiconductor device with each of the cavities including a vacuum aperture therein.

In this embodiment, the apparatus further includes a first transfer mechanism including a rotatable arm adapted for releasably securing the semiconductor device carrier to a portion of the arm. The first transfer mechanism is in selective connection with a vacuum source and the vacuum apertures in the cavities of the semiconductor device carrier. The arm of the first transfer mechanism is movable to a first location adjacent the strip of singulated semiconductor devices where the singulated semiconductor devices are secured in the corresponding cavities in the semiconductor device carrier under the force of the vacuum source applied to the vacuum apertures. The arm is then movable to a second location. The apparatus further includes a second transfer mechanism which releasably engages the semiconductor device carrier and disconnects it from the first transfer mechanism to moves the semiconductor device carrier to a carrier unload position.

The apparatus further includes a semiconductor sorting mechanism including a robotic arm movable between the carrier unload position and predetermined locations for unloading the semiconductor devices. The robotic arm includes a pickup head including a plurality of vacuum ports connected to a vacuum source. The pickup head vacuum ports are selectively able to extend down from the pickup device and pick up a plurality of singulated semiconductor devices and release the semiconductor devices at a predetermined location. The sorting mechanism includes a controller for controlling movement of the robotic arm from the carrier unload position to the predetermined locations and for controlling the vacuum ports of the pickup head for selectively picking up semiconductor devices from the semiconductor device carrier under the force of the vacuum source and releasing the semiconductor devices with assistance of compressed air when the pickup head of the robotic arm has reached a predetermined location. The controller of the semiconductor sorting mechanism receives the electronic strip map information regarding the address and quality of the singulated semiconductor devices located on the semiconductor device carrier and directs the pickup head to selectively pick up a plurality of semiconductor devices from the semiconductor device carrier and transfer the semiconductor devices to a predetermined location to unload the semiconductor devices at that location.

In one embodiment, the apparatus further includes a vision module located adjacent the semiconductor device carrier at the carrier unload position wherein the vision module includes a visual inspection system that visually inspects the semiconductor devices after they have been picked up by the pickup head of the sorting mechanism.

According to another embodiment of the present invention, there is provided a method for transferring a plurality of semiconductor devices arranged in a matrix format where the spacing between the adjacent rows and columns of semiconductor devices is represented by $\alpha$ and $\gamma$ respectively, with the rows constituting the x-axis and the columns constituting the y-axis, to a receiving apparatus having a plurality of receptacles in a matrix format for receiving the semiconductor devices where the spacing between the adjacent rows and columns of receptacles is $\delta$ and $\beta$ respectively, where $\alpha$ and $\gamma$ are different from $\delta$ and $\beta$. The method includes the step of providing a pickup device having a plurality of vacuum ports attached to a vacuum source for picking up a plurality of semiconductor devices with the vacuum ports arranged in a matrix format so that when the pickup head has picked up semiconductor devices, the spacing between the adjacent rows and columns of semiconductor devices on the pickup head is represented by $\alpha$ and $\beta$ respectively.

The pickup device moves adjacent to the plurality of semiconductor devices so that the row of vacuum ports having $\alpha$ spacing are in alignment with the rows of semiconductor devices having $\alpha$ spacing. The first column of vacuum ports is positioned vertically above the first column of semiconductor devices and the first column of vacuum ports extend down to pick up the first column of semiconductor devices. The pickup device moves along the x-axis so that the second column of semiconductors devices is vertically aligned with the second column of vacuum ports and the second column of vacuum ports extend down to pick up the second column of semiconductor devices. The pickup head continues to move along the x-axis so that each successive column of vacuum ports in the pickup device is vertically aligned with each successive column of semiconductor devices to pick up the successive columns of semiconductor devices. The pickup device then moves to the receiving apparatus so that the columns of vacuum ports in the pickup device having $\beta$ spacing between the semiconductor units are in alignment with the columns of the receptacles of the receiving apparatus having $\beta$ spacing. The first row of vacuum ports holding semiconductor devices is positioned vertically above the first row of receptacles and the pickup device then releases the first row of semiconductor devices from vacuum ports under the force of compressed air into the first column of receptacles.

The pickup device moves along the y-axis so that the second row of vacuum ports of the pickup device is in vertical alignment with the second row of receptacles and the pickup device releases the semiconductor units into the corresponding receptacles. The pickup head continues to move along the y-axis so that each successive row of vacuum ports of the pickup device is in vertical alignment with each successive row of the receptacles of the receiving apparatus and the pickup device releases each successive row of semiconductor devices held by the pickup device under the force of compressed air into each successive row of receptacles in the receiving apparatus.

DETAILED DESCRIPTION OF THE PREFERRED EMBODIMENTS

Referring now to FIGS. 1–13, a first embodiment of a semiconductor device sorting apparatus 10 is shown. The apparatus is adapted for sorting semiconductor devices that have been singulated from strip as is known in the industry. The semiconductor strip 12 includes a plurality of semiconductor devices 14 generally arranged in a matrix format with constant spacing between the semiconductor devices on the strip. During processing of the semiconductor devices, semiconductor strip 12 is cut into individual pieces to separate or singulate each individual semiconductor device for further processing. The present semiconductor device sorting apparatus 10 is designed to work with semiconductor devices that have been singulated but are still retained in a form corresponding to their location on the semiconductor device strip.

Figure 4:
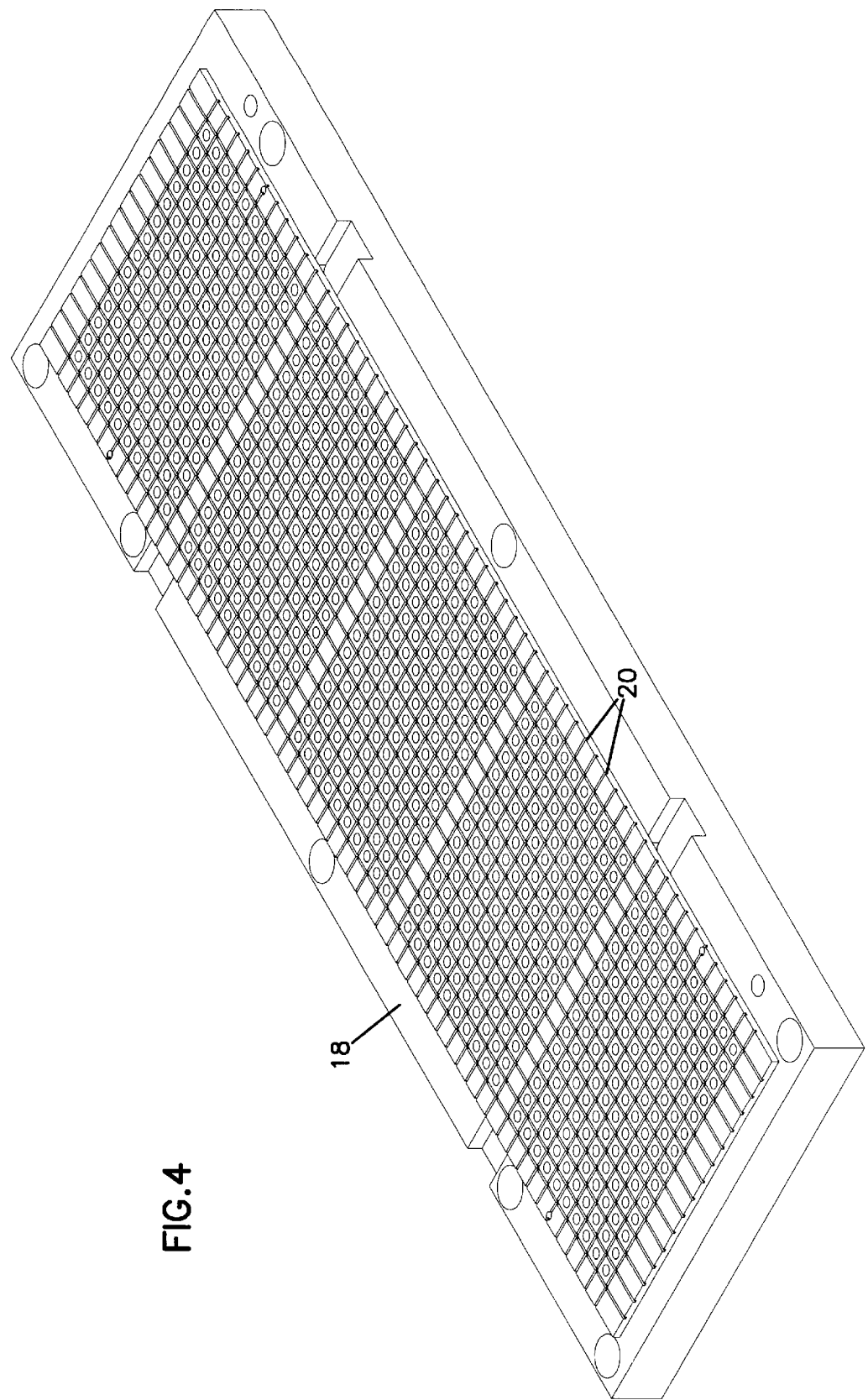
FIG. 4 is a perspective view of one embodiment of a saw chuck related to singulation of the semiconductor devices contained on the strip.
Figure 5:
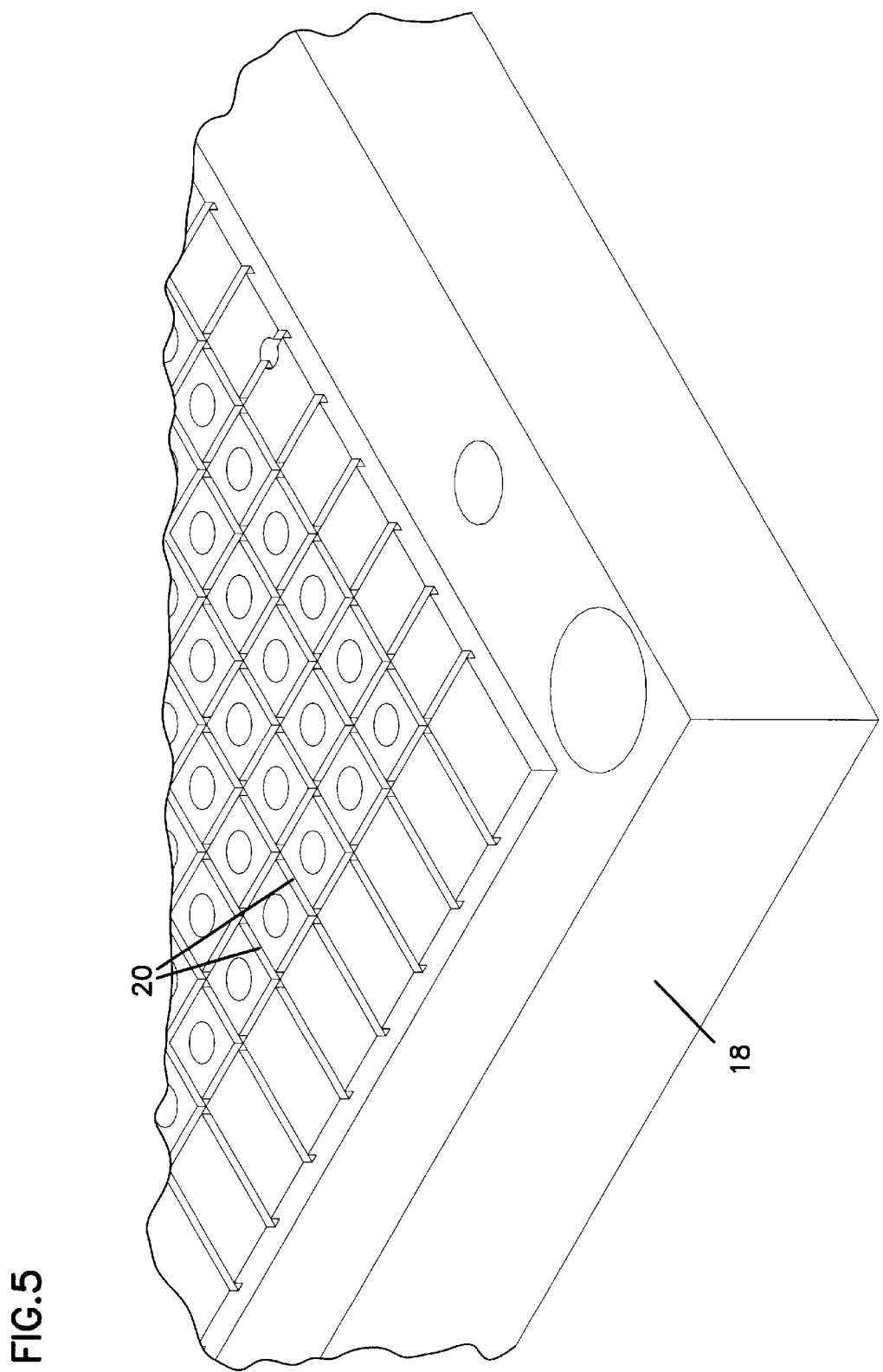
FIG. 5 is an enlarged view of a portion of the saw chuck of FIG. 4.

Referring to FIG. 4, a saw chuck 18 is displayed which displays a typical format for receiving a semiconductor strip and subsequently cutting the semiconductor strip into individual semiconductor devices. The saw chuck 18 as shown in FIG. 5 includes grooves 20 which correspond to where the saw blade intersects the semiconductor strip for singulating the semiconductor strip into individual semiconductor devices. The present method and apparatus can be used with a variety of singulation devices. One such singulation system is the integrated MTI NSX250DS dual spindle singulation system. Such a system utilizes a saw chuck as shown at 18 on FIG. 4 for singulating the semiconductor devices.

The present invention is further designed for use in sorting semiconductor devices that have been singulated from a semiconductor strip where an electronic strip map has been created corresponding to the singulated semiconductor devices on the strip. It is known in the industry to create an electronic strip map through testing of the semiconductor strip prior to singulation of the individual semiconductor devices. For example, the integrated MCT Tapestry Strip Handler manufactured by Micro Component Technology is able to test a strip of semiconductor devices and create an electronic strip map which contains specific address (or location) information related to each specific semiconductor on the strip and further includes quality information (i.e., such as "good" or "bad") for each semiconductor device on the strip based on the testing. The industry organization of Semiconductor Equipment and Materials International (SEMI) has promulgated draft standards relating to the creation of electronic strip maps for strips of semiconductor devices. The present invention is designed for integral use with strips of semiconductor devices for which an electronic strip map has been created.

Figure 1:
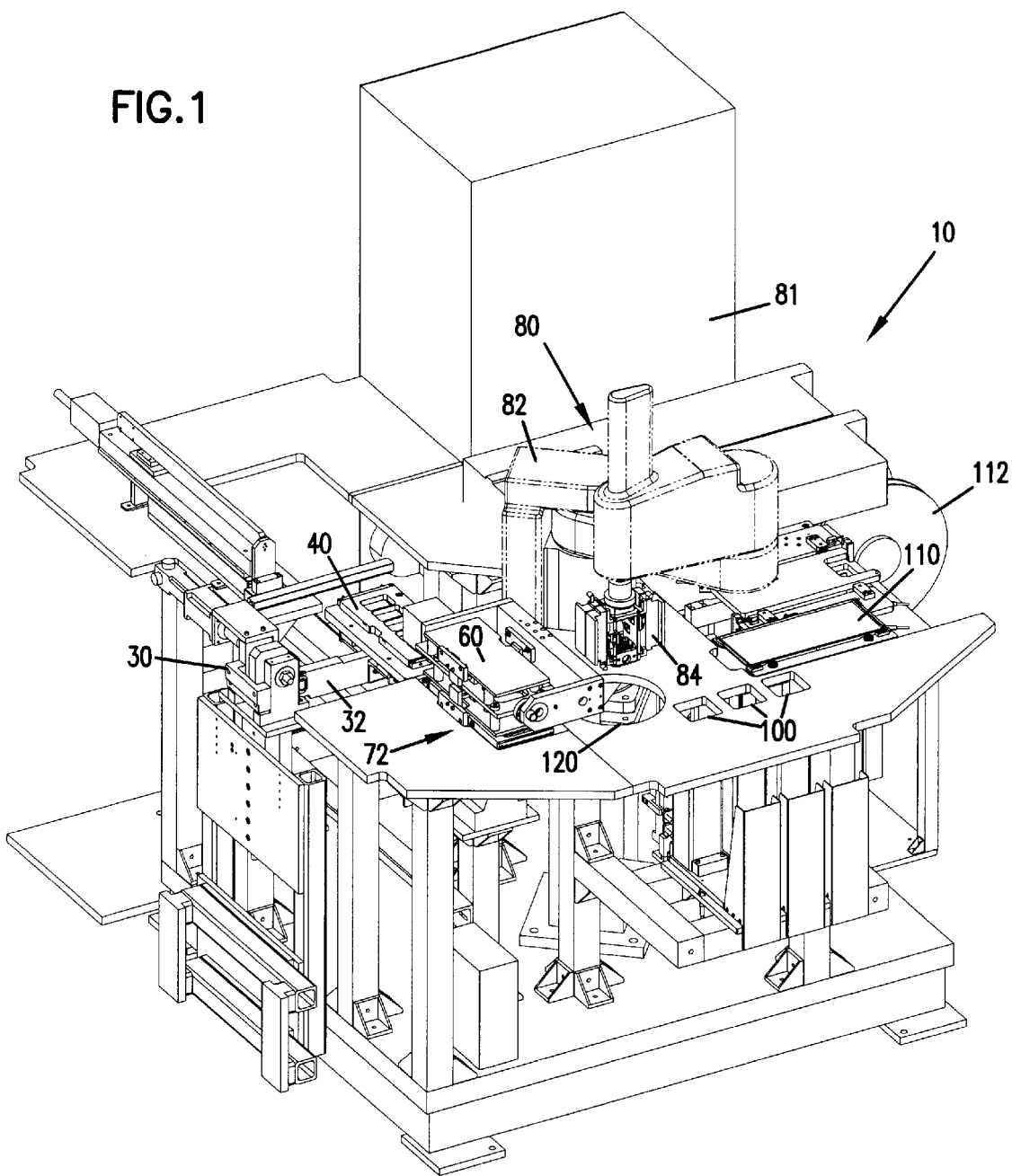
FIG. 1 is a perspective view of a first embodiment of an apparatus for sorting semiconductor devices in accordance with the principles of the present invention.
Figure 6:
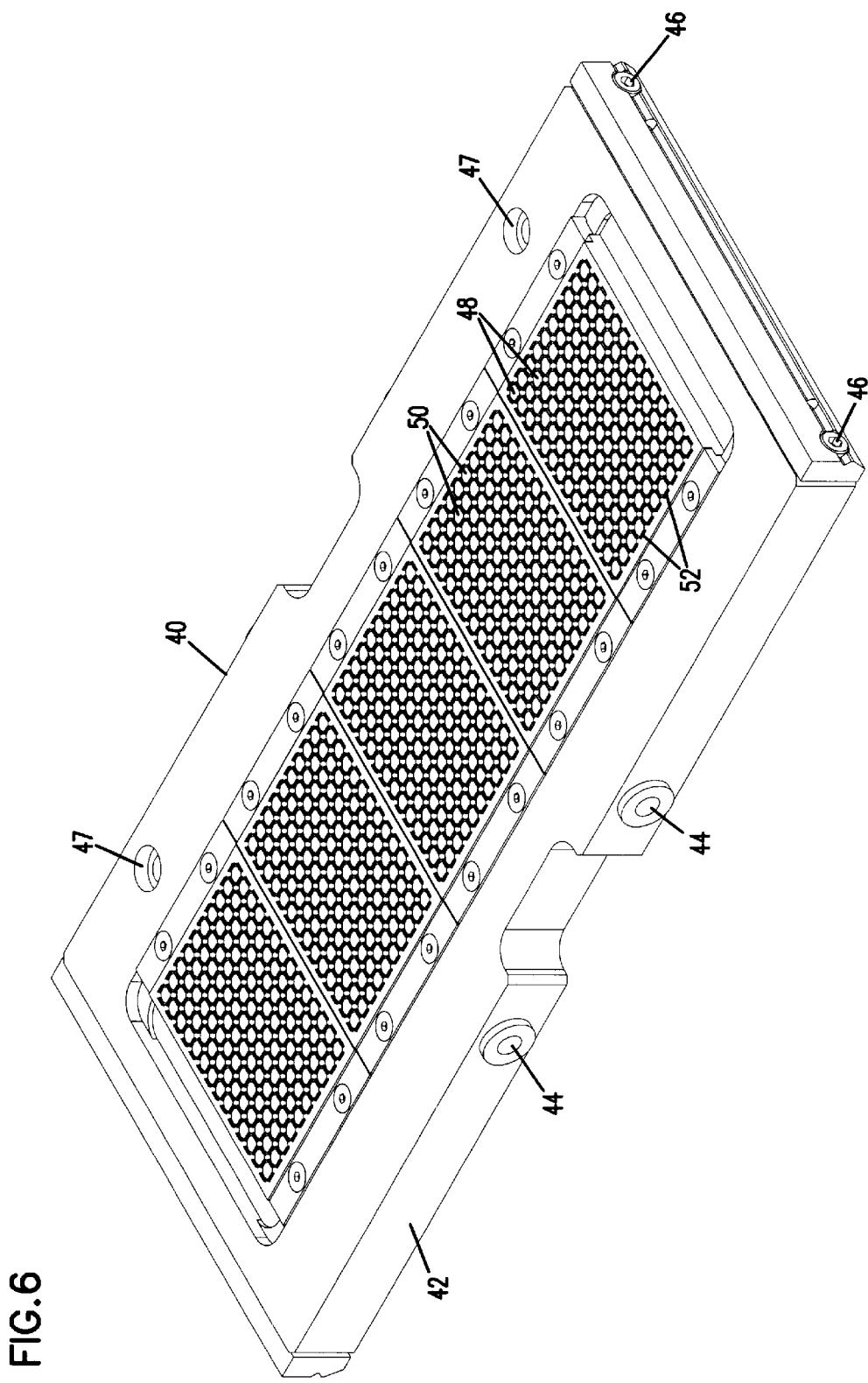
FIG. 6 is a perspective view of one embodiment of a semiconductor device carrier in accordance with the principles of the present invention.
Figure 7:
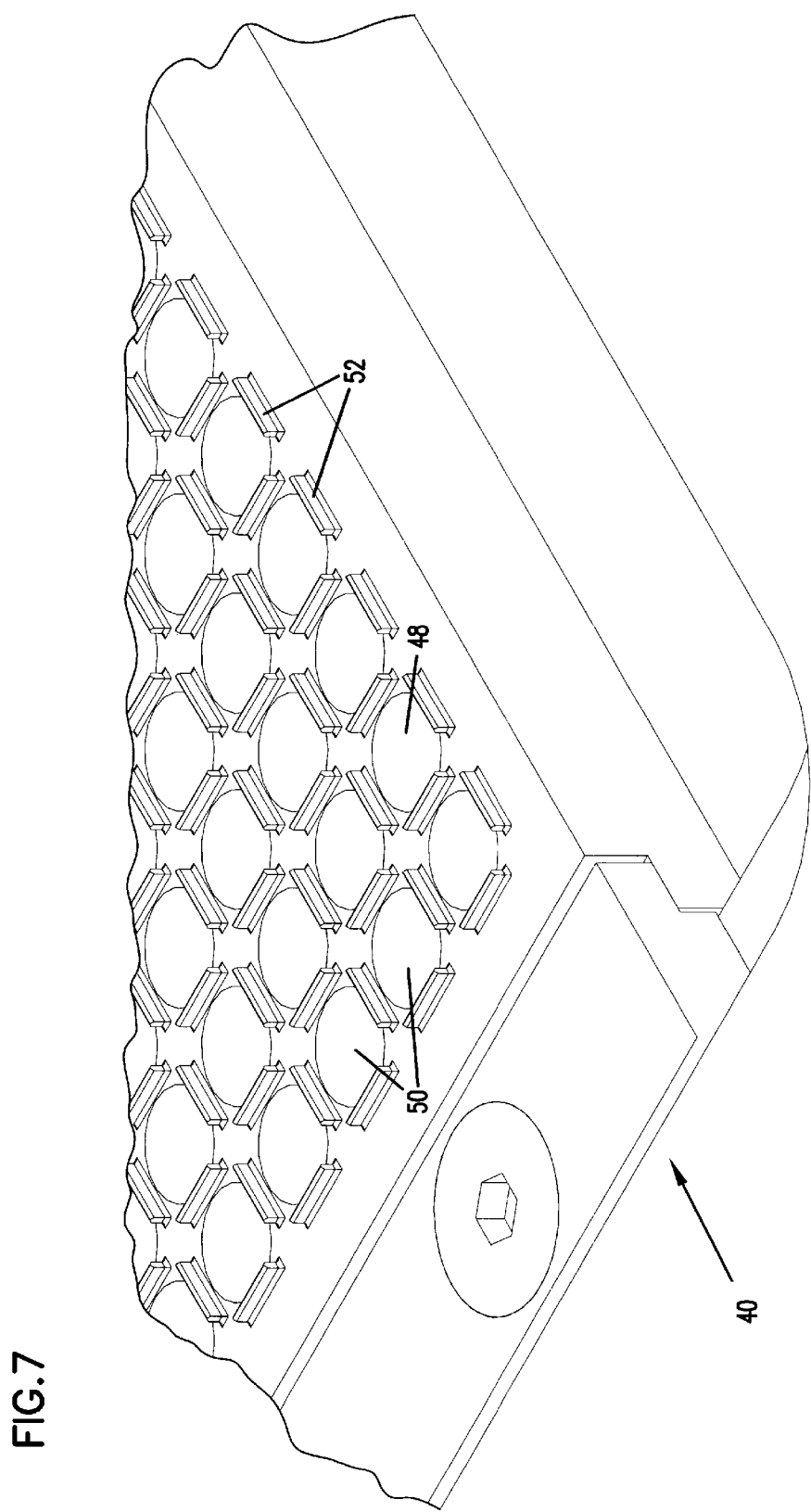
FIG. 7 is an enlarged view of a portion of the semiconductor device carrier shown in FIG. 6.

Referring to FIG. 1, a first embodiment of the sorting apparatus is shown and includes a semiconductor device carrier 40 which is moveable between a first transfer mechanism or flipper device 30 and a second transfer mechanism or carrier pick and place unit 60. Referring to FIG. 6, the semiconductor device carrier 40 includes a base 42 having a top portion forming a plurality of cavities or receptacles 48 for receiving semiconductor devices therein. The semiconductor device carrier preferably includes side mounting holes 44 and end holes 46 to assist in moving the carrier. Alignment holes 47 are positioned through a portion of the semiconductor device carrier 40 for securing the device at the carrier unload position 72. Referring to FIG. 7, the cavities or receptacles 48 include vacuum apertures 50 and upwardly extending inserts 52 which form the cavity for receiving the semiconductor device therein. In one embodiment, the inserts 52 are designed to correspond to the grooves 20 in the saw chuck 18 (see FIGS. 4–5) so that the semiconductor devices are maintained in their strip orientation when being transferred to the semiconductor device carrier.

The semiconductor device carrier 40 is adapted to be retained on a first transfer mechanism or flipper device 30.

Figure 8:
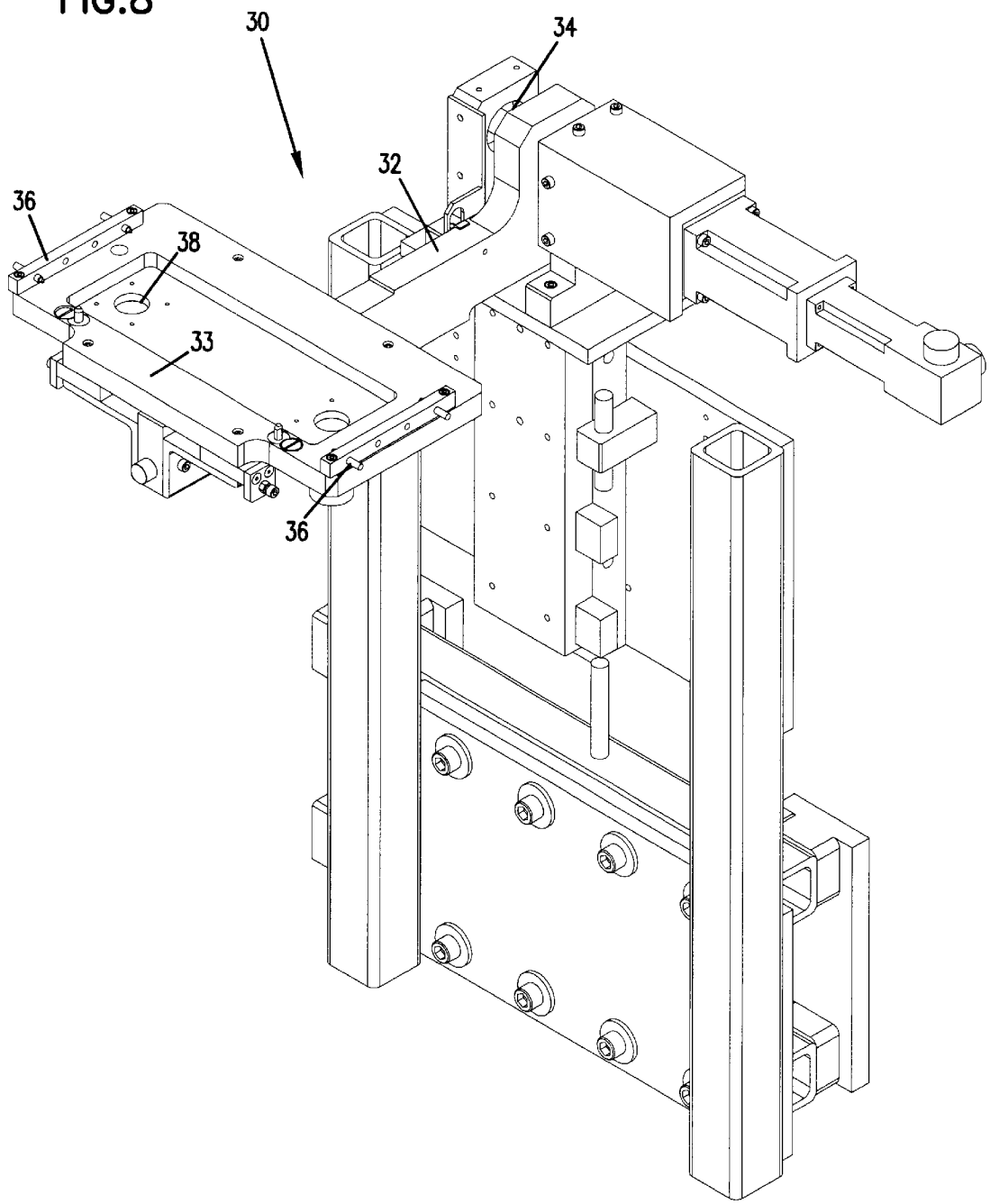
FIG. 8 is a perspective view of one embodiment of a first transfer mechanism or flipper unit in accordance with the principles of the present invention.
Figure 9:
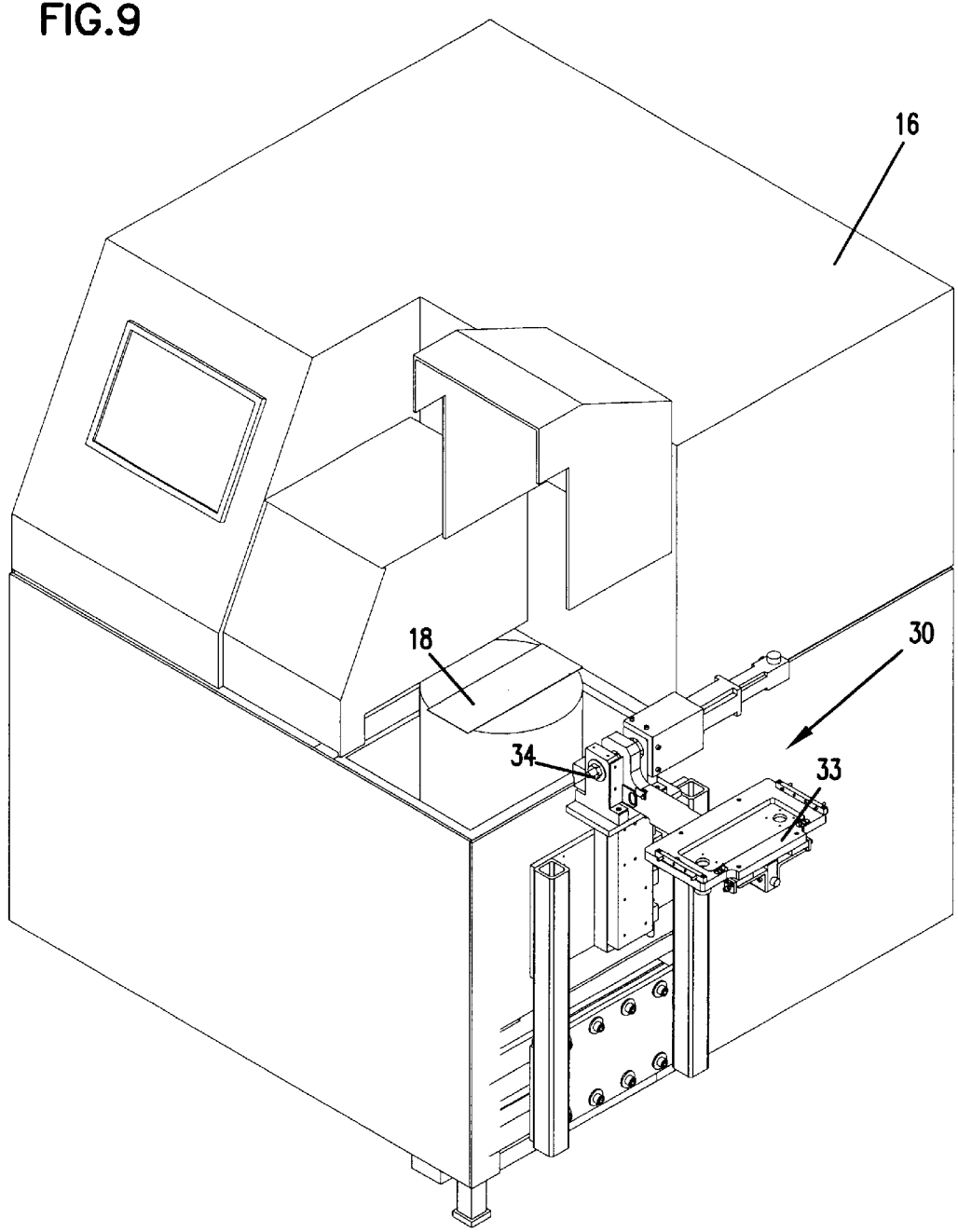
FIG. 9 is a perspective view of the first transfer mechanism shown in FIG. 8 shown in position adjacent a singulation or cutting apparatus.
Figure 10:
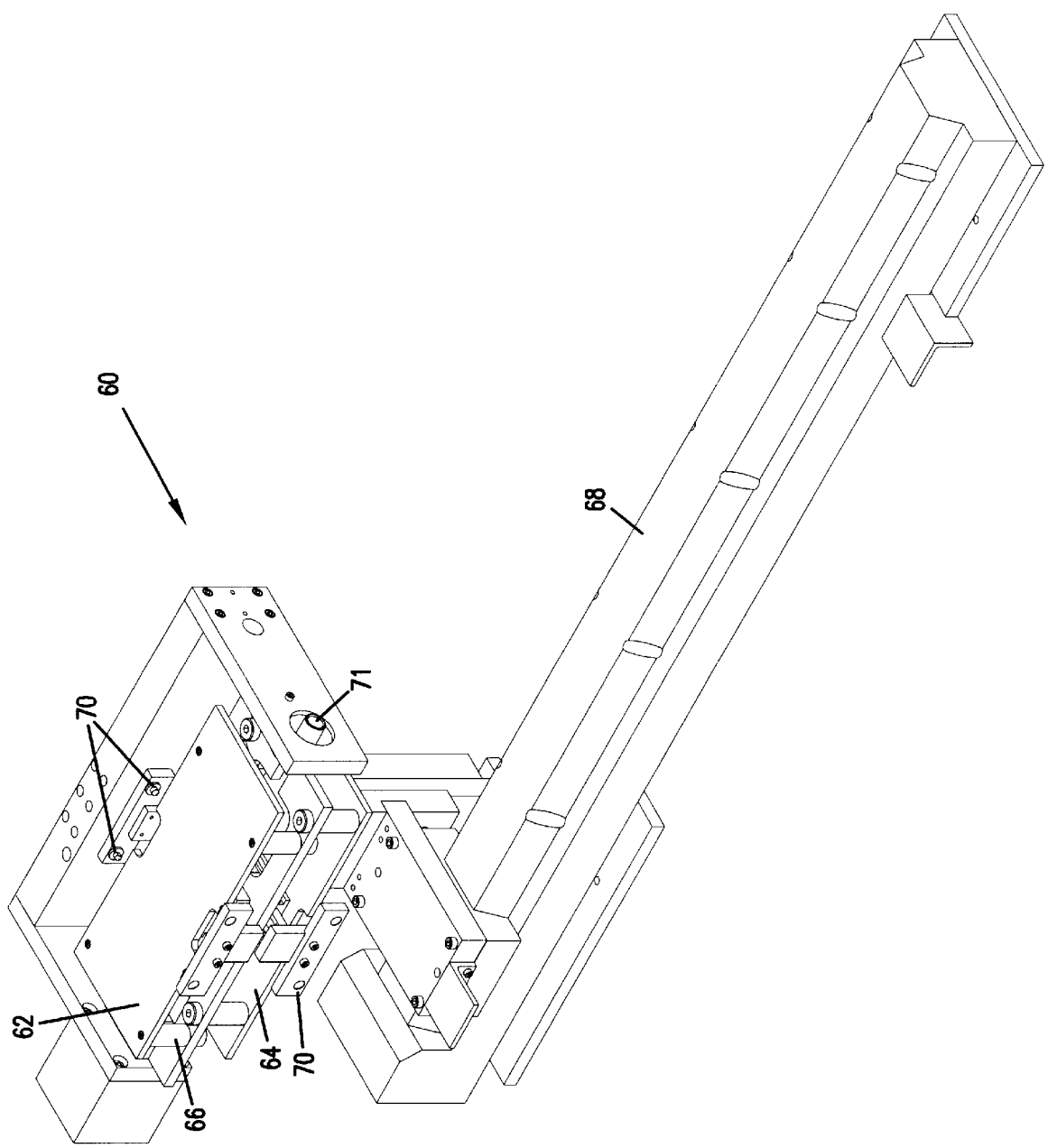
FIG. 10 is a perspective view of one embodiment of a second transfer mechanism or carrier pick and place unit in accordance with the principles of the present invention.
Figure 11:
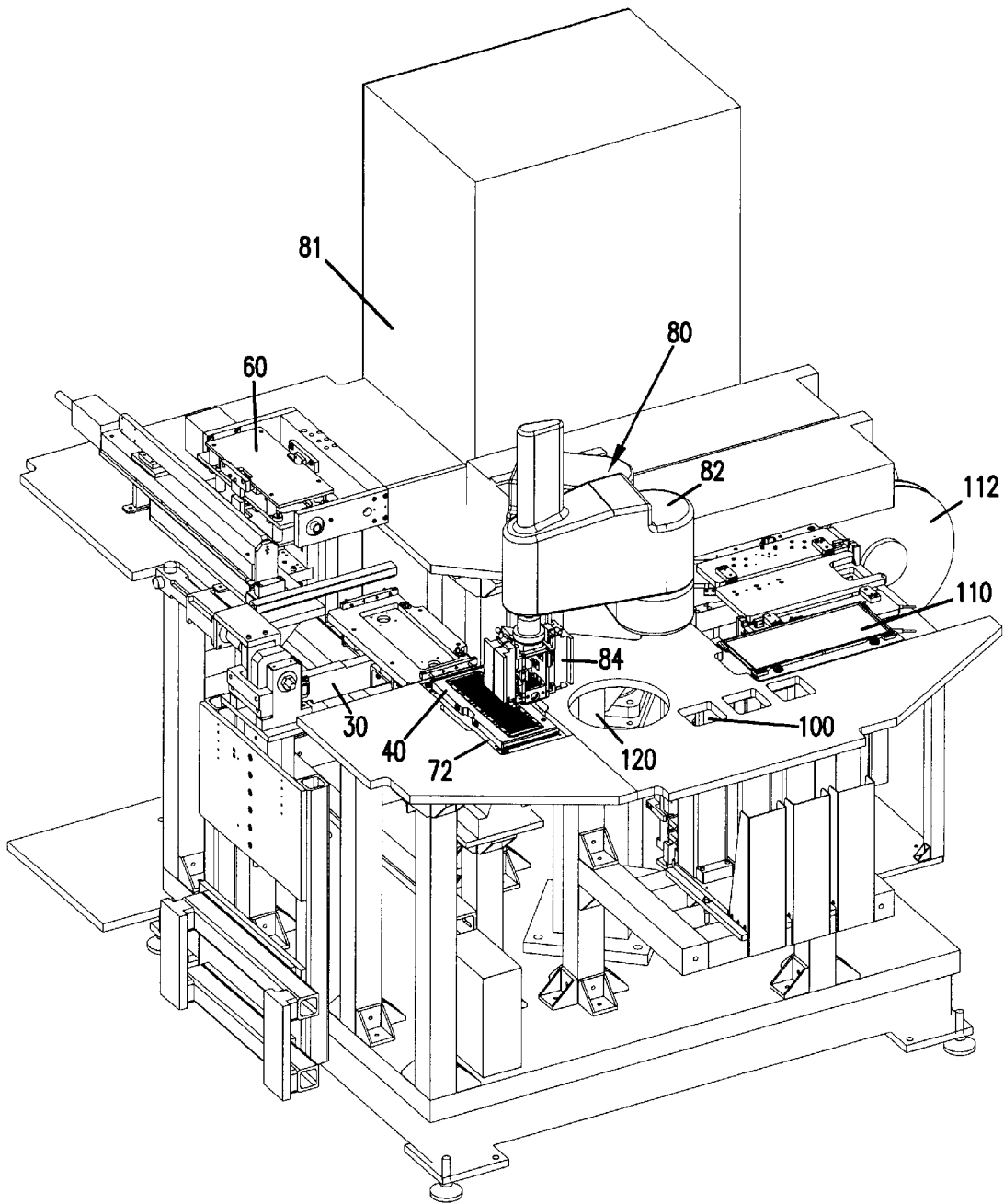
FIG. 11 is a perspective view similar to FIG. 1 showing the pickup head at the carrier off load position.
Figure 12:
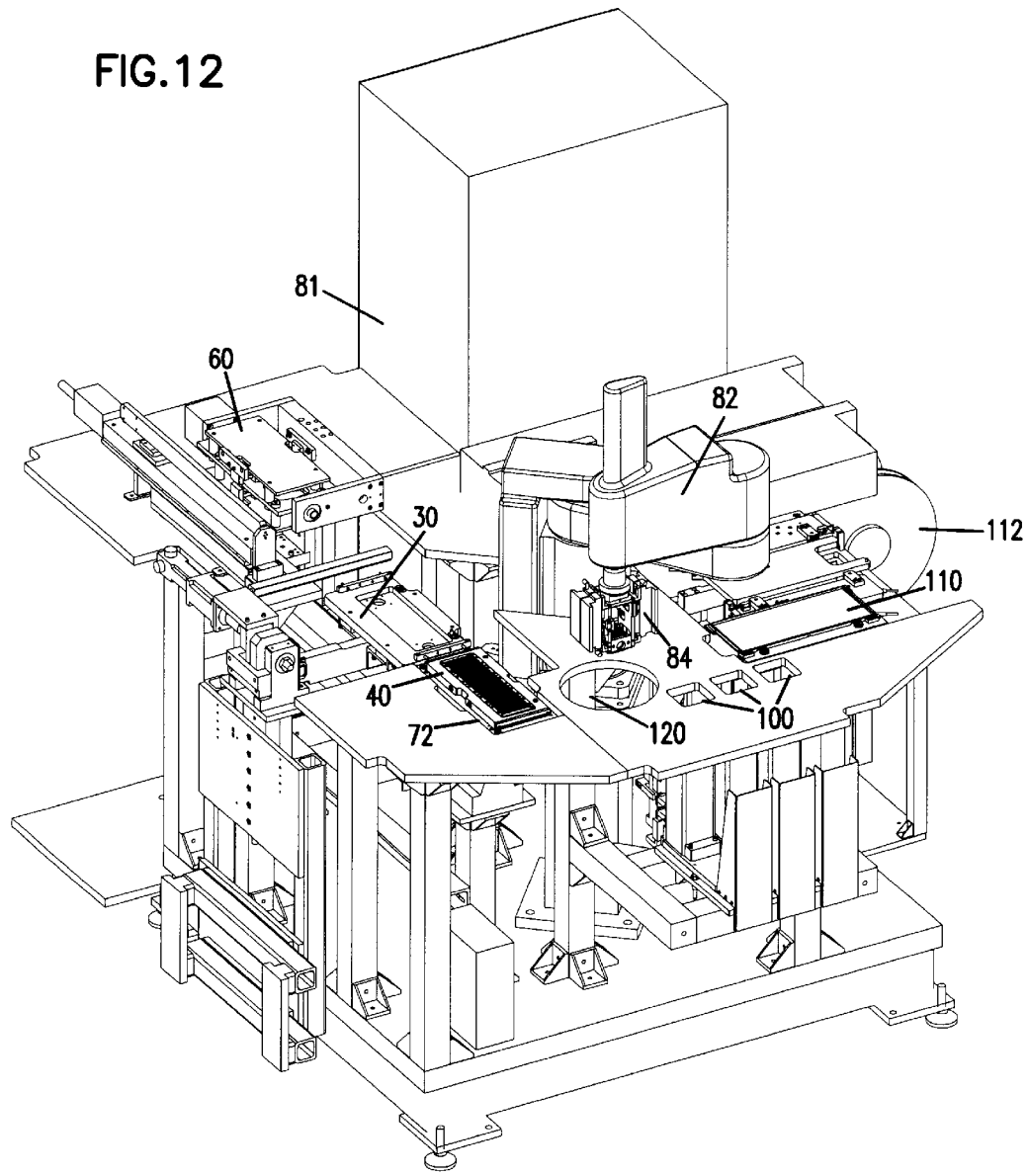
FIG. 12 is a perspective view similar to FIG. 1 showing the pickup head at the visual inspection module.
Figure 13:
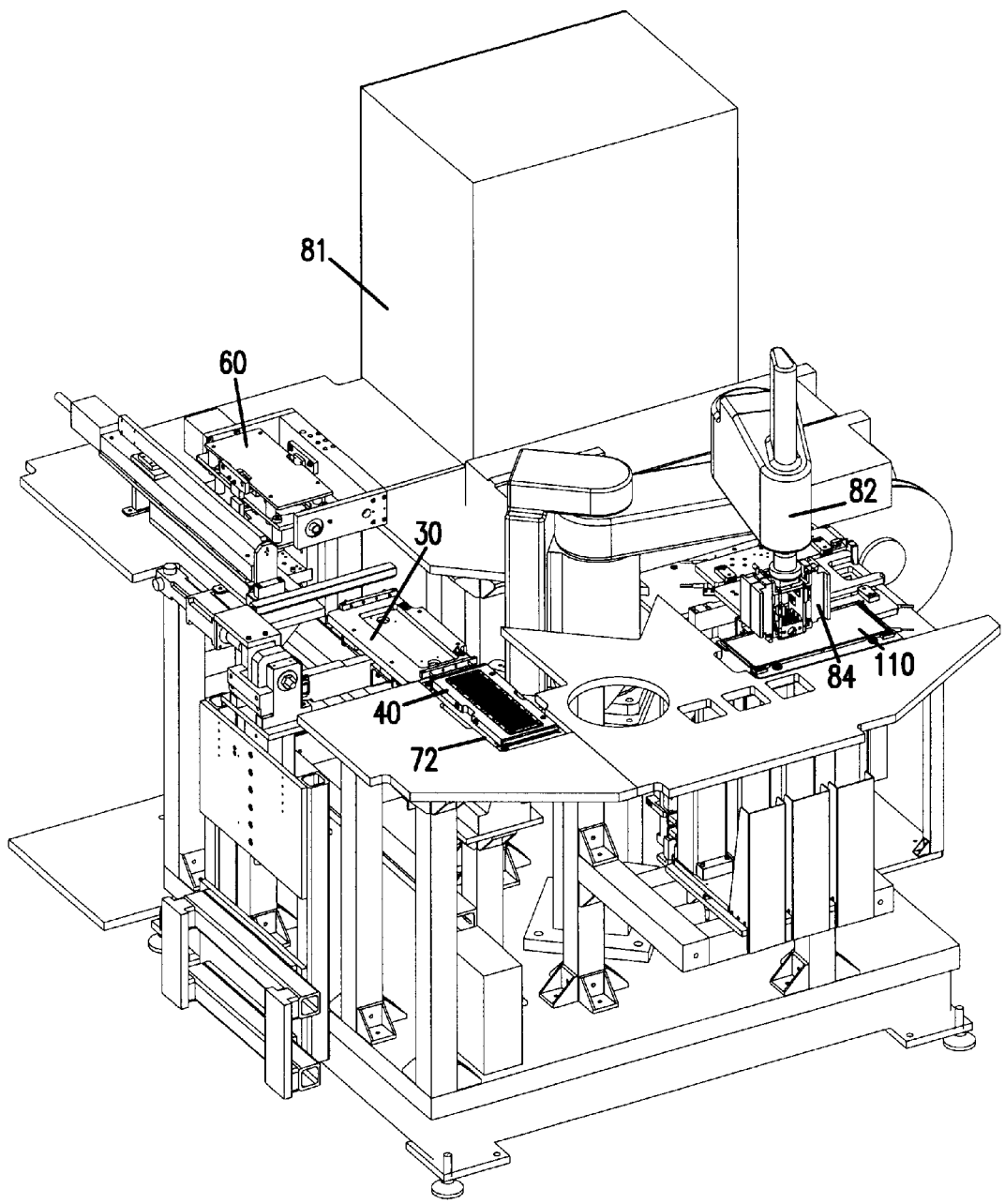
FIG. 13 is a perspective view similar to FIG. 1 showing the pickup head at the tray off load position.

Referring to FIG. 8, the flipper includes an arm 32 which is connected to a pivot shaft 34 which allows the arm to pivot about a horizontal axis between a first load position and a second unload position. In one embodiment, the semiconductor device carrier 40 is adapted to fit on the end portion 33 of the arm 32 opposite the pivot shaft 34 of the flipper 30. The end portion 33 of the arm includes spring loaded detents 36 which engage the end holes 46 in the semiconductor device carrier 40 to securely retain the semiconductor device carrier on the flipper arm 32. Referring to FIG. 9, the flipper unit 30 is preferably disposed adjacent to the singulation apparatus 16 where the strip of semiconductor devices have been singulated (or cut) into individual devices while being retained on a saw chuck 18. The flipper arm 32 is adapted for selective connection to a vacuum source (not shown). With the semiconductor device carrier 40 securely disposed on the flipper arm 32, the flipper unit 30 connects to the vacuum source so that vacuum apertures 50 of the semiconductor device carrier 40 are pulling a vacuum. The flipper arm pivots the semiconductor device carrier 180 degrees to a location adjacent the saw chuck 18 of the singulation apparatus 16. In this way, the inserts 52 of the semiconductor device carrier 40 extend between the singulated semiconductor devices 14 which have just been cut and the vacuum apertures 50 pick up the semiconductor devices 14 for retention in the cavities or receptacles 48 of the semiconductor device carrier 40. The flipper arm 32 then rotates (or flips) back to its initial position away from the singulation apparatus 16. In this way, the semiconductor devices are inverted from their position on the saw chuck.

Pursuant to this embodiment, the sorting apparatus 10 further includes a second transfer mechanism or carrier pick and place device 60 adapted to transfer the semiconductor device carrier 40. The carrier pick and place 60 is preferably adapted for travel along a track or rail 68 for movement between the flipper arm 32 and a carrier unload position 72. Alternatively, the carrier pick and place unit 60 could further be adapted for transferring the semiconductor device carrier 40 to a washing unit prior to transferring the semiconductor device carrier 40 to the carrier unload position. In a preferred embodiment, the carrier pick and place 60 includes an upper base plate 62 and lower base plate 64 so that it is able to pick up and transfer two semiconductor device carriers at one time. It is appreciated that this simply increases the efficiency of the apparatus and it not necessary to utilize two semiconductor device carriers with the sorting apparatus 10.

The carrier pick and place unit 16 preferably includes engagement pins 70 which are designed for engagement with the corresponding side mounting holes 44 in the semiconductor device carrier 40. The carrier pick and place unit 60 is adapted to engage the semiconductor device carrier 40 by lowering a base plate 62 or 64 to engage and cover the top portion of the semiconductor device carrier 40 which contains the singulated semiconductor devices. The base plates 62, 64 are spring biased against the top of the cavities or receptacles 48 of the semiconductor device carrier 40 to prevent any semiconductor devices from being dislodged from their position in the semiconductor device carrier 40. At this point, the engagement pins 70 engage the corresponding side mounting holes 44 so that the carrier pick and place unit 60 then picks up the semiconductor device carrier 40 (which releases the carrier from connection to the flipper arm) and transfers it to a carrier unload position 70. At the carrier unload position 72, preferably the alignment holes 47 engage corresponding pins at the carrier unload position to retain the semiconductor device carrier 40 in precise alignment.

In one embodiment, the carrier pick and place unit 60 can preferably be designed to engage one semiconductor device carrier 40 and rotate it 180 degrees about a pivot shaft 71 so that it can then pick up a second semiconductor device carrier 40. In this way, the carrier pick and place unit 60 can pick up a fully loaded semiconductor device carrier 40 from the flipper arm 32 and move it to the carrier unload position where an unloaded semiconductor device carrier 40 is disposed. The carrier pick and place unit 60 can then rotate 180 degrees so that the empty base plate can then engage the empty semiconductor device carrier to retain it on the carrier pick and place 60. The carrier pick and place unit 60 then pivots another 180 degrees so that the fully loaded semiconductor device carrier is transferred to the carrier unload position for subsequent off loading by the sorting mechanism. The carrier pick and place then returns the empty semiconductor device carrier 40 to the flipper arm 32 of the first transfer mechanism 30 where it can then be moved to the singulation unit 16 to pick up a new set of singulated semiconductor devices from a strip that has just been cut.

Referring to FIG. 1, the semiconductor apparatus 10 includes a sorting mechanism 80 which is composed of a robotic arm 82 which includes a pickup head 84 disposed at one end of the robotic arm 82. The robotic arm 82 can constitute a variety of commercially available robotic arms as are known for use in the semiconductor industry. Once such robotic arm is the Adept Cobra 600 robot manufactured by Adept Technology.

The sorting mechanism 80 includes a controller 81 which serves to control the operation of the robotic arm 82 and the pickup head 84 based on information received from the electronic strip map transferred to the controller 81. The controller 81 controls the precise movement of the robotic arm 82 between the various positions such as the carrier off load position 72 and the any various unload positions such as the bins 100 or trays 110. The controller 81 operates the pickup head 84 to control extension of the vacuum ports 86 downward to pick up the singulated semiconductor devices as well as control operation of the solenoid valves 92 to allow the individual vacuum ports to pick up the semiconductor devices. The controller 81 further controls whether the vacuum ports are picking up under the force of a vacuum or blowing out under the force of compressed air. The controller may take a variety of forms including hardware or software to control the sorting mechanism 80. In one embodiment, the controller constitutes a combination of Adept software language and other commercial software languages for motion control of the robotic arm 82 and associated sorting control of the pickup head 84.

Figure 2:
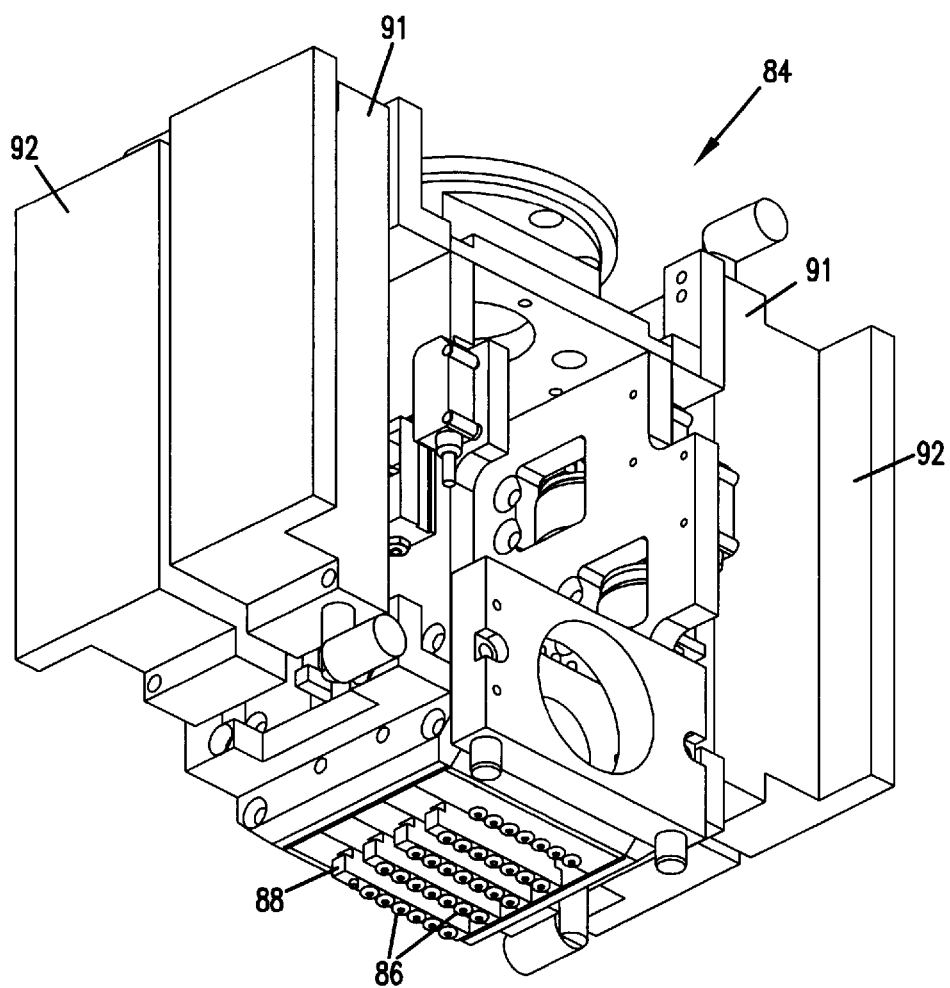
FIG. 2 is a perspective view of one embodiment of a pickup head of the semiconductor device sorting apparatus according to the principles of the present invention.
Figure 3A:
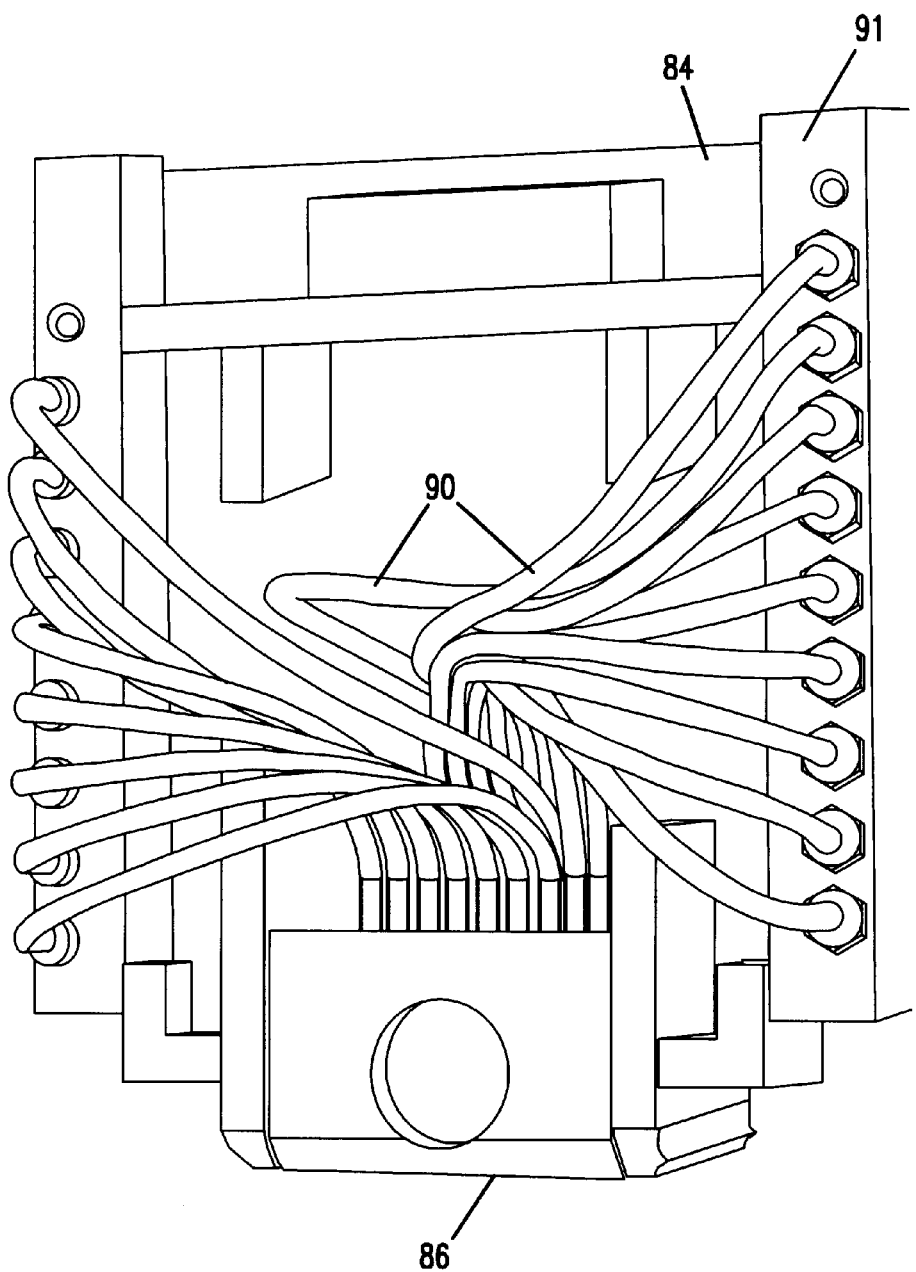
FIG. 3A is a partial perspective view of one embodiment of a pickup head of the semiconductor device sorting apparatus.
Figure 3B:
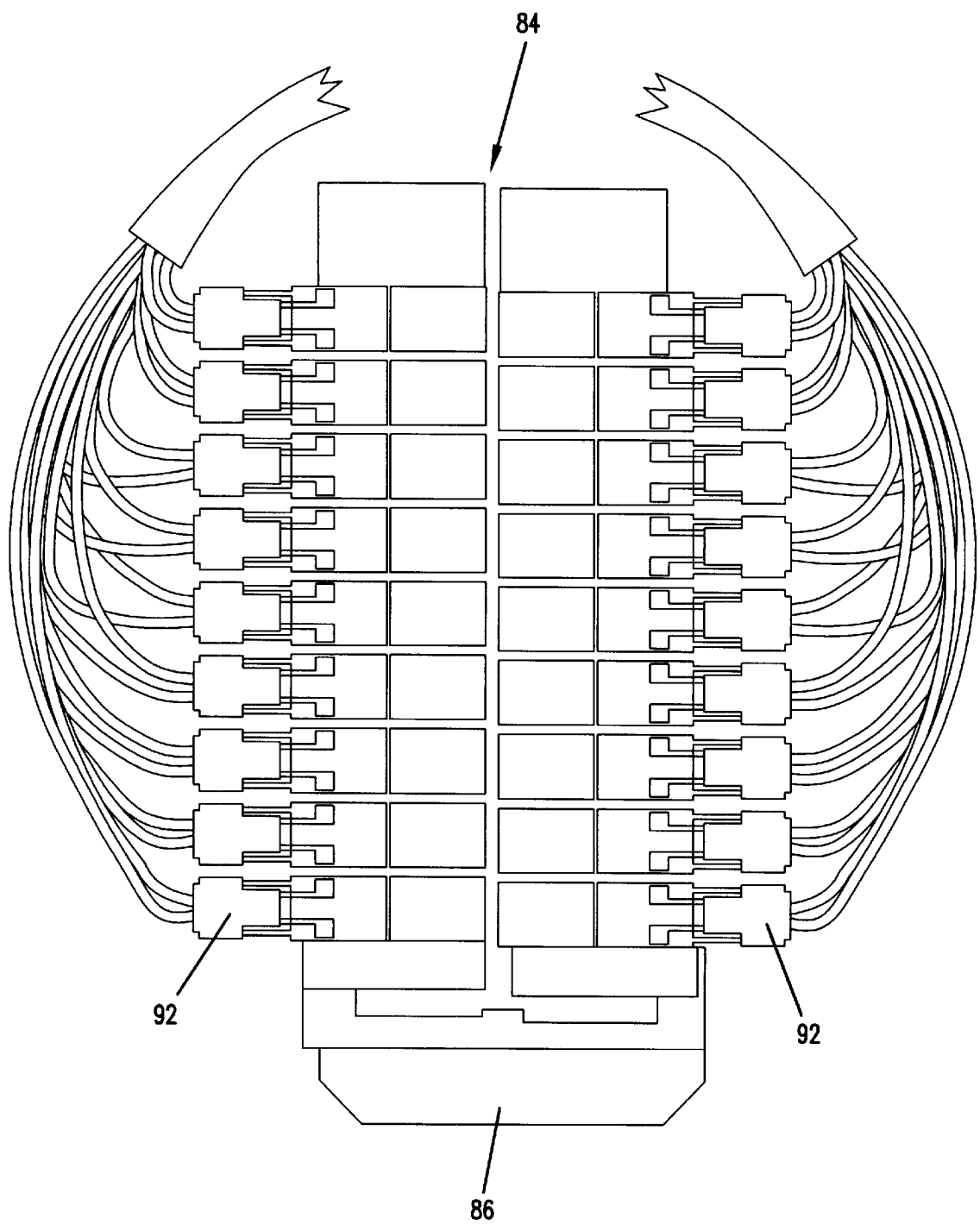
FIG. 3B is a partial side view of one embodiment of a pickup head of the semiconductor device sorting apparatus.

The pickup head 84 is secured to the end of the robotic arm 82 for precise movement of the pickup head. The pickup head 84 includes a plurality of vacuum ports 86 which may be placed in a matrix format of rows and columns as shown in FIG. 2 (FIG. 2 does not show the vacuum tubes for clarity purposes). The vacuum ports are preferably contained in rows of blocks 88 as shown in FIG. 2 where each row of vacuum ports is able to extend downward independently of the other rows. Preferably, the vacuum ports are connected through vacuum tubes 90 to a manifold 91 (constituting an air passageway) which is connected to a vacuum/compressed air source (see FIG. 3A which shows the tubes 90). Separate solenoid valves 92 are connected to the air passageway for each vacuum port 86 (see FIG. 3B) to control airflow for that particular port. In this way, under the control of the robotic arm, the pickup head is able to move to precise locations as directed by the robotic arm and to further activate the vacuum ports through the solenoid valves to either pickup semiconductor devices under the force of a vacuum or release the semiconductor devices under the force of compressed air. The pickup head 84 of the sorting mechanism 80 is designed for precise travel between the carrier unload position and predetermined locations for unloading of the semiconductor devices pickup up by the pickup head 84. Referring to FIG. 1, such predetermined locations for unloading the semiconductor devices include bulk bins 100, JEDEC tray holders 110, tape and reel holders 112, or tubes. The JEDEC tray holders and tape and reel holders are adapted to receive JEDEC trays and tape and reels for retaining singulated semiconductor devices for further processing as is known in the industry. The bins 100 can be designated into "good" or "bad" bins depending on the application.

In a preferred embodiment, the sorting apparatus 10 includes a vision module 120 which is positioned between the carrier unload position and the predetermined locations for unloading semiconductors such as the bins or JEDEC trays. The vision module 120 constitutes a commercially available vision inspection system for semiconductors as is known in the industry. One such example of a vision module is a RFSI vision module manufactured by Visionscape. The vision module is able to visually inspect the semiconductor devices which have been picked up by the pickup head by the vacuum ports of the pickup head to determine which vacuum ports have picked up a particular semiconductor device and to further perform quality testing to determine if the semiconductor devices are "good" or "bad". The vision module 120 is in communication with the controller 81 to provide information regarding the visual inspection so that the controller can modify its unloading movements if appropriate.

A preferred embodiment of a system or method for sorting singulated semiconductor devices will now be disclosed with reference to the sorting apparatus 10 as described above. The preferred method for sorting singulated semiconductor devices includes moving the pickup head 84 to a location where the singulated semiconductor devices are disposed in a form which corresponds to their positioning on the strip 12. In one embodiment, the semiconductor carrier device 40 is used to remove the semiconductor devices from the saw chuck of a singulation apparatus 16 while retaining the semiconductor devices in their precise orientation as retained on the strip. The semiconductor device 40 is then transferred to a carrier unload load position 72 where the semiconductor devices are ready to be off loaded by the pickup head 84 to a predetermined location for further processing. The electronic strip map information relating to the specific singulated semiconductor devices from a particular strip is provided to the controller 81 of the sorting mechanism 80 so that the controller is able to move the pickup head 84 to the carrier unload position to begin intelligent off loading of the semiconductor devices to the appropriate location.

Figure 15:
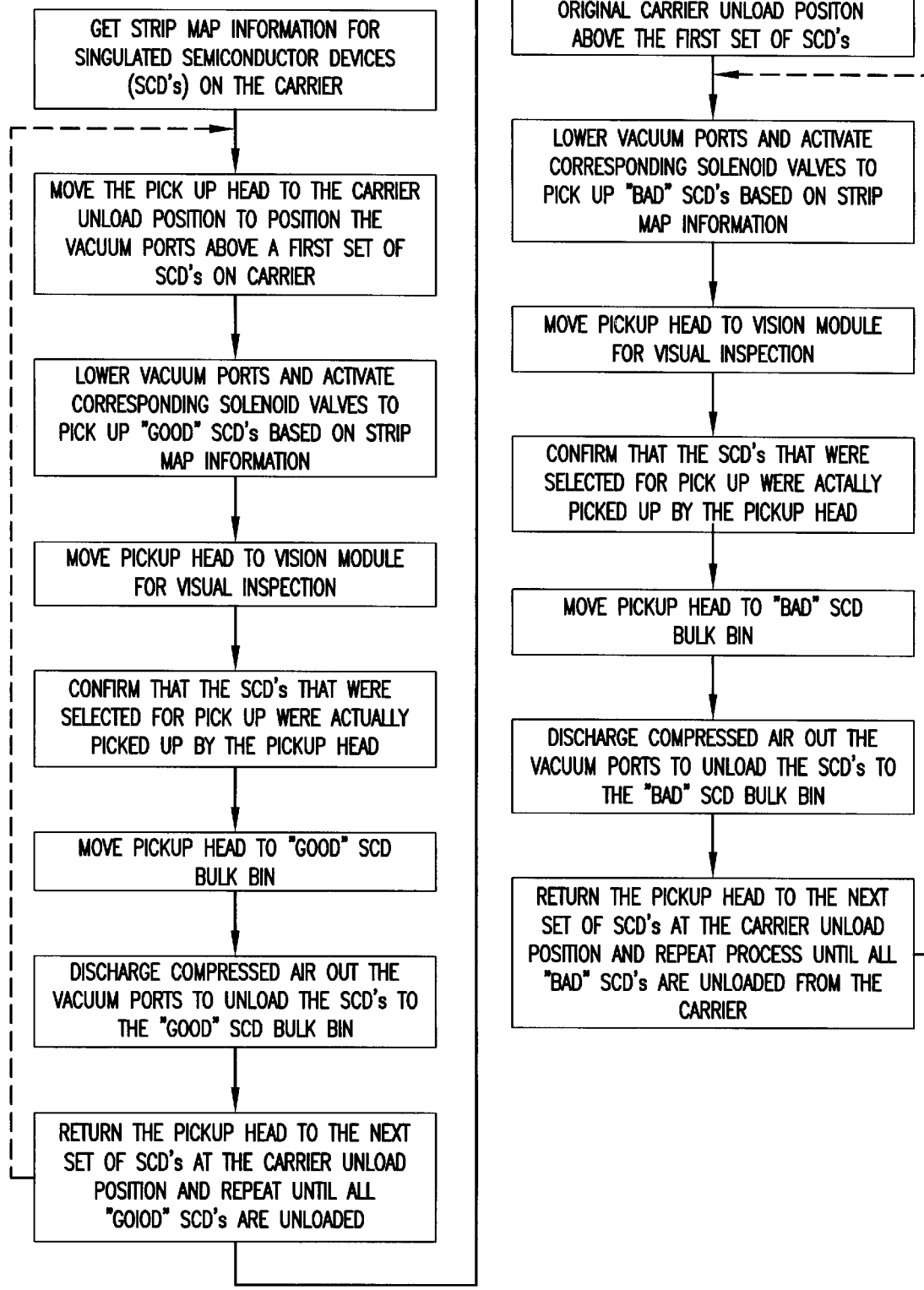
FIG. 15 is a system diagram of one embodiment of a method for sorting semiconductor devices in accordance with the principles of the present invention.

An illustrative example will now be described as shown in FIG. 15 where the illustration application calls for transferring "good" semiconductor devices to the "good" bulk bin and for transferring "bad" semiconductor devices to the "bad" bulk bin. In this example, the controller 81 receives the strip map information for the singulated semiconductor devices on the carrier at the carrier off load position. The controller 81 then moves the pickup head 84 to the carrier unload position 72 to position the vacuum ports of the pickup head above a first set of semiconductor devices on the carrier. The controller 81 then lowers the vacuum ports 86 and activates the corresponding solenoid valves 92 to pick up the "good" semiconductor devices based on the information it has received from the electronic strip map for this particular strip of semiconductor devices.

Preferably, the controller 81 then moves the pickup head 84 to a vision module 120 for visual inspection. At this point the vision module confirms that the semiconductors that were selected for pick up by the controller were actually picked up by the pickup head 84. If, for example, one semiconductor device was not picked up that should have been, the controller can take appropriate action such as returning back to the carrier unload position to pick up the semiconductor device. The vision module 120 can also perform a visual quality inspection in which the vision module determines whether the individual semiconductor devices are "good" or "bad" and communicate this information to the controller 81. If the information from the vision module 120 does not correspond to the information from the electronic strip map, the controller 81 can update the information and take appropriate action with respect to any semiconductor devices which the vision module shows as having a different quality characteristic than electronic strip map. For example, if the vision module determines that a particular semiconductor device is "bad" even though the strip map designated the device as "good", the controller can then modify its placement of that device from a "good" location to a "bad" location.

Continuing on with this illustrative example, the controller 81 then moves the pickup head to the "good" semiconductor device bulk bin and discharges compressed air out the vacuum ports to unload the first set of semiconductor devices to the "good" bulk bin.

After the first set of "good" semiconductor devices have been unloaded to the "good" bulk bin, the controller 81 moves the pickup head 84 back to the carrier unload position 72 and positions the pickup head over the next set of semiconductor devices and repeats the process of picking up and moving the "good" semiconductor devices to the "good" bulk bin until all of the "good" semiconductor devices at the carrier unload position 72 have been unloaded to the "good" bulk bin.

In this preferred embodiment, the controller 81 then returns the pickup head 84 to the original carrier unload position above the first set of semiconductor devices and then lowers the vacuum ports and activates the corresponding solenoid valves to pick up the "bad" semiconductor devices based on the information provided by the electronic strip map. The controller 81 then moves the pickup head to the vision module for visual inspection to confirm that the semiconductor devices that were selected for pickup were actually picked up by the pickup head. The controller 81 then moves the pickup head to the "bad" semiconductor device bulk bin and discharges compressed air out the vacuum ports to unload the semiconductor devices to the "bad" bulk bin. The controller then moves the pickup head to the carrier unload position to position the vacuum ports of the pickup head above the next set of semiconductor devices on the carrier and repeats the process until all of the "bad" semiconductor devices on the strip have been properly unloaded to the "bad" bulk bin.

Preferably, at that point, the first and second transfer mechanisms (30,60) have replaced the empty semiconductor device carrier with a semiconductor device carrier containing a new strip of singulated semiconductor devices and the process of unloading the "good" and "bad" semiconductor devices is repeated with the controller 81 utilizing the strip map information for this new strip of singulated semiconductor devices.

In the above example, it is shown how the method for sorting semiconductor devices is able to intelligently pick up multiple singulated semiconductor devices at one time and sort and move the devices to a predetermined off load location for further processing. It is appreciated that the sorting mechanism 80 can provide for moving the semiconductor devices to a variety of predetermined locations such as the bulk bins, JEDEC trays, and tape and reels, or tubes. It is further understood that the sorting mechanism 80 can be used in conjunction with a vision module 120 to confirm and update the electronic map information related to specific semiconductor devices that are to be transferred. In this way, this method provides for fast efficient transfer of multiple semiconductor devices at one time and further allows for sorting based on quality information (i.e. "good" or "bad") obtained either from the strip map or from the visual inspection.

As noted above, the above described invention can be used for off loading singulated semiconductor devices to JEDEC trays such as are common in the semiconductor industry. In one embodiment, a specific method for picking up the singulated semiconductor devices is provided since the spacing of the semiconductor devices in the JEDEC trays is typically different from the spacing of the singulated semiconductor devices in the strip format. This difference in spacing between the singulated semiconductor devices and the JEDEC trays requires a method for maintaining proper pitch of the semiconductor devices to correctly place them in a JEDEC tray for further processing.

An illustrative example of this method for picking up the singulated semiconductor devices for loading into a JEDEC tray for further processing is now provided where it is assumed that the spacing between the singulated semiconductor units is represented by $\alpha$ and $\gamma$ where $\alpha$ and $\gamma$ can be the same spacing parameter. It is further assumed that the spacing between the semiconductor devices in the JEDEC trays is $\delta$ and $\beta$ where $\delta$ and $\beta$ can also be the same spacing parameter but where $\alpha$ and $\gamma$ are different spacing parameters than $\delta$ and $\beta$. In this example, the rows are designated as constituting the x-axis and the columns as constituting the y-axis.

Figure 14:
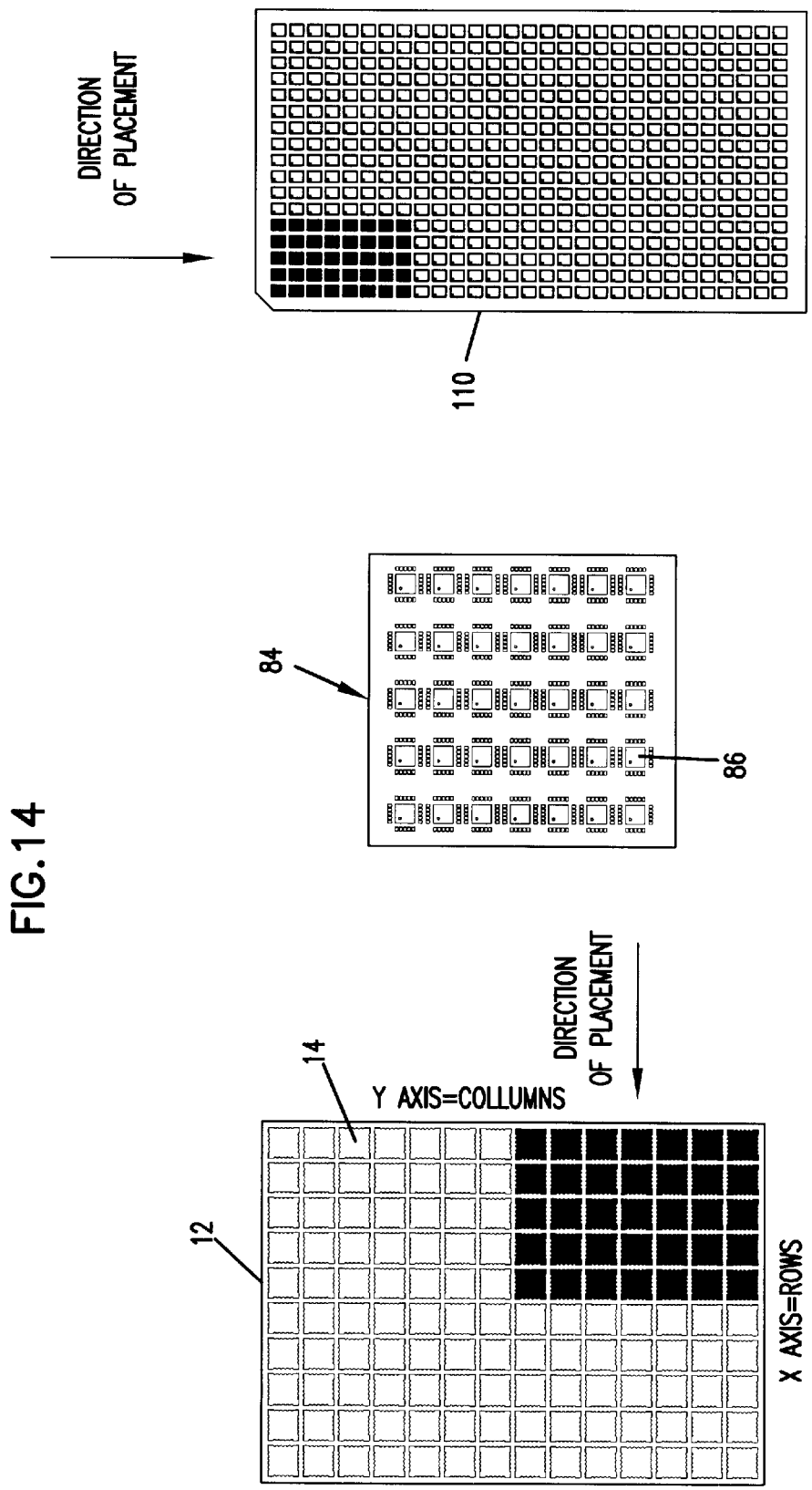
FIG. 14 is a system diagram of one embodiment illustrating a method for pickup and unloading of singulated semiconductor devices.

Referring to FIG. 14, the method includes providing a pickup head 84 in which the vacuum ports are arranged in a matrix format so that when the pickup head has picked up semiconductor devices, the spacing between adjacent rows and columns of semiconductor devices on the pick up head is represented by $\alpha$ and $\beta$ respectively. The pickup head 84 then moves to the singulated semiconductor devices so that the rows of vacuum ports having $\alpha$ spacing are in alignment with the rows of semiconductor devices having $\alpha$ spacing (see FIG. 14). Further, the pickup head is positioned so that the first column of vacuum ports is positioned vertically above the first column of semiconductor devices. The pickup head then picks up a first column of semiconductor devices by extending the vacuum ports of the first column downward from the pickup device. The pickup head then moves along the x-axis so that the second column of vacuum ports is vertically aligned with the second column of semiconductor devices and picks up the second column of semiconductor devices by extending down the second column of vacuum ports in the pickup head 84. This process is then repeated as the pickup device moves along the x-axis so that each successive column of vacuum ports in the pickup device is vertically aligned with each successive column of semiconductor devices which are then picked up by the vacuum ports in the pickup device.

Once all the columns of vacuum ports 86 in the pickup head 84 have picked up semiconductor devices, the pickup head 84 then moves to the JEDEC tray but is aligned so that the columns of vacuum ports in the pickup device having $\beta$ spacing between the semiconductor units are in alignment with the columns of the JEDEC tray having $\beta$ spacing. Referring to FIG. 14, the direction of placement (or unloading) is along the y-axis where the direction of pickup is along the x-axis. The first row of vacuum ports holding semiconductor devices is positioned vertically above the first row of receptacles in the JEDEC tray. The pickup head then releases the first row of semiconductors on the vacuum ports under the force of compressed air into the first row of corresponding receptacles in the JEDEC tray. The pickup head then moves along the y-axis so that the second row of vacuum ports of the pickup device is in vertical alignment with the second row of receptacles in the JEDEC tray and then releases the semiconductor devices into the corresponding receptacles in the JEDEC tray. The pickup head then continues to move along the y-axis so that each successive row of vacuum ports of the pickup device is in vertical alignment with each successive row of receptacles in the JEDEC tray and then releases each successive row of semiconductor devices under the force of compressed air into each successive row of receptacles in the JEDEC tray.

Referring to FIG. 14, this process can then be repeated based on the number of vacuum ports in the pickup head to pick up the singulated devices from their strip orientation position and off load the devices to corresponding positions to fill the JEDEC trays. Various alternative methods may be used in accordance with the electronic strip map information received from the corresponding to the singulated semiconductor devices. For example, if the JEDEC tray is only to be loaded with "good" semiconductor devices, the method may provide for skipping "bad" semiconductor devices and leaving an empty receptacle in the JEDEC tray which can then be filled in at a later time from semiconductor devices further down the strip. After the JEDEC tray is loaded with "good" semiconductor devices from a particular strip, the remaining "bad" semiconductor devices can then be picked up and moved to a receptacle for receiving the "bad" semiconductor devices such as a bulk bin. It is further understood that a variety of alternative methods of pickup may be utilized to sort and unload the semiconductor devices in a variety of different sorting orientations based on a particular application for use.

It is further contemplated that the semiconductor sorting apparatus 10 may further incorporate a user interface into the system in which a user interface such as a PC may be connected with the controller 81 of the sorting mechanism 80 to allow a user to modify applications of the sorting apparatus 10. For example, such a user interface may allow for the user to choose which off loading position, such as bulk bins, JEDEC trays or tape and reel, is to be used for a particular strip. Such a user interface would communicate with the controller 81 of the sorting mechanism 80 and could be used to input the order of the unloading process (which devices to be picked at what point in the process) and the locations for unloading of the parts (which predetermined location for the devices).

It is to be understood that even though numerous characteristics and advantages of various embodiments of the present invention have been set forth in the foregoing description, together with the details of the structure and function of various embodiments of the invention, this disclosure is illustrative only and changes may be made in the details, especially in matters of size, shape, and arrangement of the parts within the principles of the present invention to the full extent indicated by the broad general meaning of the terms in which the appending claims are expressed. All alternative modifications and variations of the present invention which fall within the spirit and broad scope of the appended claims are covered.

What is claimed is:

1. An apparatus for sorting semiconductor devices where the semiconductor devices have been singulated from a strip containing a plurality of semiconductor devices and where an electronic strip map has been created containing address and quality information related to each individual singulated semiconductor device, the apparatus comprising:

a semiconductor device carrier, adapted for receiving a plurality of singulated semiconductor devices, the semiconductor device carrier including a base portion having a top surface divided into a plurality of cavities, each sized to receive an individual singulated semiconductor device, each of the cavities including a vacuum aperture therein;

a first transfer mechanism including a rotatable arm adapted for releasably securing the semiconductor device carrier to a portion of the arm, the first transfer mechanism in selective connection with a vacuum source and the vacuum apertures in the cavities of the semiconductor device carrier, wherein the arm of the first transfer mechanism is moveable to a first location adjacent the strip of singulated semiconductor devices wherein the singulated semiconductor devices are secured in corresponding cavities in the semiconductor device carrier under the force of the vacuum source applied through the vacuum apertures and wherein the arm is moveable to a second location;

a second transfer mechanism adapted for releasable engagement with the semiconductor device carrier, the second transfer mechanism disposed adjacent to the first transfer mechanism such that when the first transfer mechanism moves to the second position, the second transfer mechanism releasably engages the semiconductor device carrier and disconnects the semiconductor device carrier from the first transfer mechanism and moves the semiconductor device carrier to a carrier unload position; and a semiconductor sorting mechanism including a robotic arm moveable between the carrier unload position and predetermined locations for unloading the semiconductor devices, the robotic arm including a pickup head including a plurality of vacuum ports connected to a vacuum source such that the pickup head vacuum ports are selectively able to extend down from the pickup device and pick up a plurality of singulated semiconductor devices and release the semiconductor devices at a predetermined location; the sorting mechanism including a controller for controlling movement of the robotic arm from the carrier unload position to the predetermined locations and for controlling the vacuum ports of the pickup head for selectively picking up semiconductor devices from the semiconductor device carrier under the force of the vacuum source and releasing the semiconductor device with assistance of compressed air when the pickup head of the robotic arm has reached a predetermined location; wherein the controller receives the electronic strip map information regarding the address and quality of the singulated semiconductor devices located on the semiconductor device carrier and directs the pickup head to selectively pickup a plurality of semiconductor devices from the semiconductor device carrier and transfer the semiconductor devices to a predetermined location to unload the semiconductor devices at that location.

2. The apparatus of claim 1 further comprising a vision module located adjacent the semiconductor device carrier at the carrier unload position wherein the vision module includes a vision inspection system that visually inspects the semiconductor devices after they have been picked up by the pickup head of the sorting mechanism and wherein the controller receives inspection information from the vision module and updates its electronic strip map information based on the information received from the vision module and adjusts the unload position for any of the particular semiconductor devices for which the electronic strip information has been modified based on the information received from the vision module.

3. The apparatus of claim 1 wherein the arm of the first transfer mechanism inverts the semiconductor device carrier when the arm moves to the first location adjacent the strip of singulated semiconductor devices to secure the singulated semiconductor devices in corresponding cavities in the semiconductor device carrier and the arm then returns the semiconductor device carrier to its original orientation as the arm moves to the second location which serves to invert the semiconductor devices secured in the carrier at the second location for subsequent transfer to the carrier unload position by the second transfer mechanism.

* * * * *